US007055124B2

(12) United States Patent
Frank et al.

(10) Patent No.: US 7,055,124 B2
(45) Date of Patent: May 30, 2006

(54) SYSTEM AND METHOD FOR EVALUATING SIGNAL DEVIATIONS IN A PACKAGE DESIGN

(75) Inventors: Mark D. Frank, Longmont, CO (US); Jerimy Nelson, Fort Collins, CO (US); David W. Quint, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 449 days.

(21) Appl. No.: 10/368,758

(22) Filed: Feb. 19, 2003

(65) Prior Publication Data

US 2004/0162714 A1 Aug. 19, 2004

(51) Int. Cl.
*G06F 17/50* (2006.01)

(52) U.S. Cl. ............................................ 716/13; 716/1

(58) Field of Classification Search ................ 716/4–6, 716/16–18, 1, 13

See application file for complete search history.

(56) References Cited

U.S. PATENT DOCUMENTS

| | | | | |
|---|---|---|---|---|
| 5,994,766 | A | 11/1999 | Shenoy et al. | |
| 5,999,714 | A * | 12/1999 | Conn et al. | 716/2 |
| 6,219,821 | B1 * | 4/2001 | Hagerman et al. | 716/5 |
| 6,349,402 | B1 * | 2/2002 | Lin | 716/2 |
| 6,581,196 | B1 * | 6/2003 | Eisenberg et al. | 716/5 |
| 6,829,754 | B1 | 12/2004 | Yu et al. | |
| 6,834,427 | B1 | 12/2004 | Cornelius et al. | |
| 2004/0163058 | A1 * | 8/2004 | Frank et al. | 716/5 |

* cited by examiner

*Primary Examiner*—Vuthe Siek
*Assistant Examiner*—Binh Tat

(57) ABSTRACT

A method is provided for evaluating signal deviations in an electronic design (e.g., a package design), including the steps of: formulating one or more signal deviation rules; processing the electronic design to determine whether the signal deviations violate the signal deviation rules; and generating an indicator (e.g., a DRC and/or report) associated with the electronic design to identify violated signal deviation rules. Processing of the electronic design may be scoped according one or a group of signal nets.

20 Claims, 9 Drawing Sheets

100
COMPUTER
114
MEMORY
122
PACKAGE DESIGN
124
DESIGN DATABASE
150
DESIGN RULES 152
SIGNAL DEVIATION RULES
153
DRCs 154
SIGNAL DEVIATION DRCs
155
REPORT SUMMARIZING SIGNAL DEVIATION VIOLATIONS 157
PROCESSOR
118
STORAGE UNIT
116
CAD SOFTWARE
112
SIGNAL DEVIATION SOFTWARE 101
GRAPHICAL USER INTERFACE
126
128
PACKAGE MODEL
124A
INPUT INTERFACE
120

155C
155B
155B
155C
155B
130(1)
130(2)
130(3)
130(4)
130(M)
132(1)
132(2)
132(3)
132(4)
132(M)
124B
L1
141
I(1)
190(1)
190(3)
190(4)
190(M)
141
I(2)
190(3)
190(1)
190(4)
141A
141B
I(N)
190(4)
190(3)
141
L2
134(1)
134(2)
134(3)
134(4)
134(M)

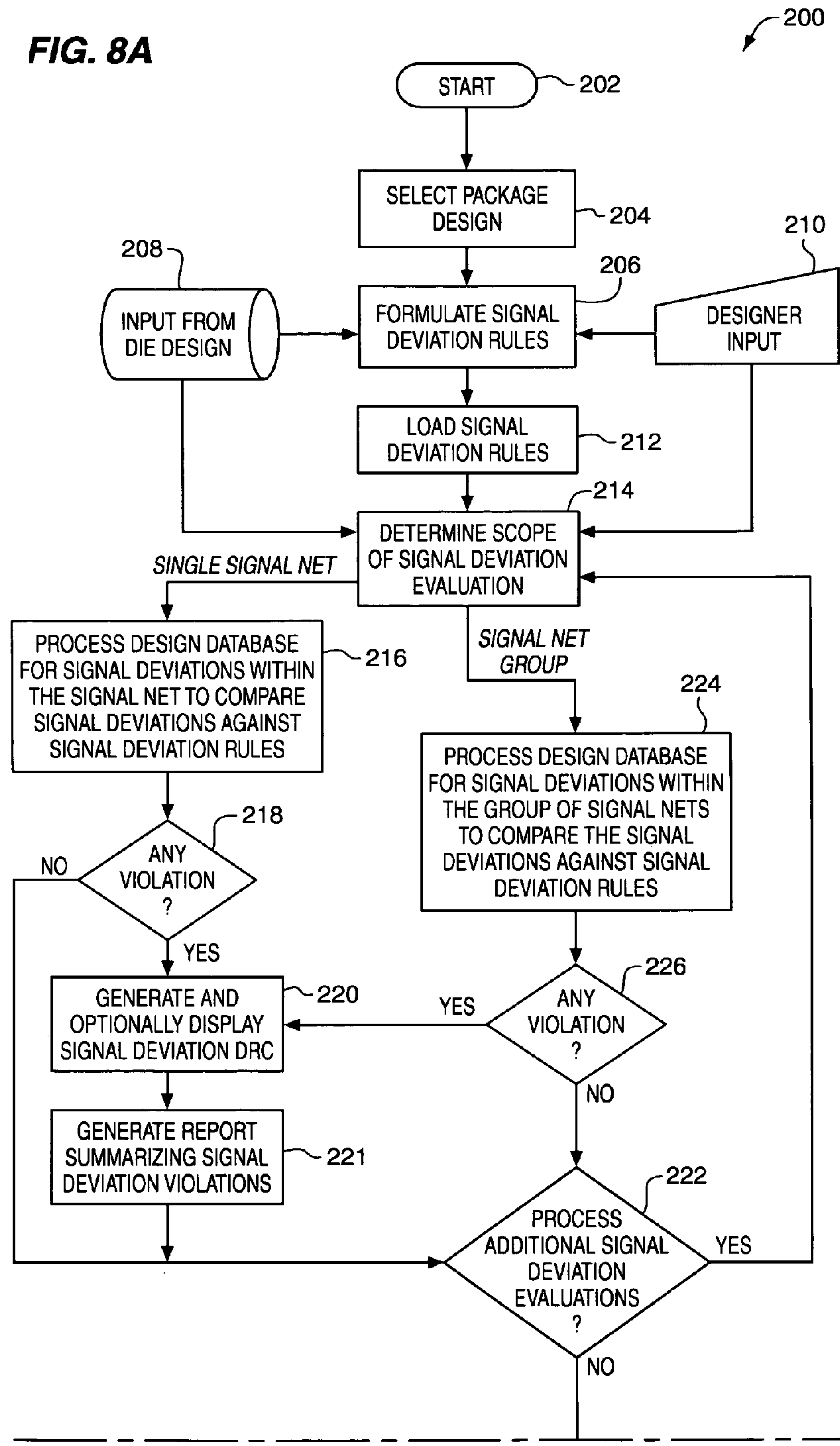
FIG. 8A
200
START
202
SELECT PACKAGE DESIGN
204
208
210
206
INPUT FROM DIE DESIGN
FORMULATE SIGNAL DEVIATION RULES
DESIGNER INPUT
LOAD SIGNAL DEVIATION RULES
212
214
DETERMINE SCOPE OF SIGNAL DEVIATION EVALUATION
SINGLE SIGNAL NET
PROCESS DESIGN DATABASE FOR SIGNAL DEVIATIONS WITHIN THE SIGNAL NET TO COMPARE SIGNAL DEVIATIONS AGAINST SIGNAL DEVIATION RULES
216
SIGNAL NET GROUP
224
PROCESS DESIGN DATABASE FOR SIGNAL DEVIATIONS WITHIN THE GROUP OF SIGNAL NETS TO COMPARE THE SIGNAL DEVIATIONS AGAINST SIGNAL DEVIATION RULES
218
ANY VIOLATION ?
NO
YES
GENERATE AND OPTIONALLY DISPLAY SIGNAL DEVIATION DRC
220
YES
226
ANY VIOLATION ?
NO
GENERATE REPORT SUMMARIZING SIGNAL DEVIATION VIOLATIONS
221
222
PROCESS ADDITIONAL SIGNAL DEVIATION EVALUATIONS ?
YES
NO

SYSTEM AND METHOD FOR EVALUATING SIGNAL DEVIATIONS IN A PACKAGE DESIGN

RELATED APPLICATIONS

This application is related to the following commonly owned and co-filed U.S. patent applications, each of which is incorporated herein by reference: U.S. patent application Ser. No. 10/368, 988, filed Feb. 19, 2003, titled "System And Method For Evaluating Vias Per Pad In A Package Design": U.S. patent application Ser. No. 10/368,837. filed Feb. 19, 2003. titled "System And Method For Evaluating Signal Coupling Between Differential Traces In A Package Design": U.S. patent application Ser. No. 10/368.789, filed Feb. 19, 2003, titled "System And Method For Evaluating Power and Ground Vias In A Package Design": U.S. patent application Ser. No. 10/368,776, filed Feb. 19, 2003, titled "System And Method For Evaluating Signal Coupling Between Vias In A Package Design": and U.S. patent application Ser. No. 10/368,778. filed Feb. 19, 2003, titled "System And Method For Evaluating Signal Trace Discontinuities In A Package Design".

BACKGROUND

Prior art computer aided design (CAD) software is known to include complementary tool suites for designing and analyzing the package of a die, e.g., a microprocessor. A "package" is the physical interconnection between the die and, for example, a printed circuit board (PCB). A typical package has several interconnected layers between its top level (Level 1), which connects to the die, and its bottom level (Level 2), which connects to the PCB.

A package "design" is a hierarchical and symbolic digital model of the package circuit. Those skilled in the art appreciate that hardware description languages (HDLs) may be used to formulate this digital model. The digital model consists of linked design elements that simulate the package circuit. The design elements are for example digital representations of the transistors, resistors, logic gates, traces (i.e., intra-level conductors), capacitors, vias (i.e., inter-level connectors), and wire bonds that make up the simulated schematic circuit.

The design elements and interconnections are collated and defined in a design database, which is a textual representation of the package design. The design database may further describe the package design in terms of higher-level cells consisting of two or more design elements, and the connections between cells. Each "net" in the package design describes the linked conductors (e.g., traces of a level and vias between levels) that form a circuit between an input and an output of the package. The CAD software may automatically route traces within a given level of the package design; it may further automatically route vias between levels of the package design.

The design database is processed by the CAD software to perform circuit simulation. The CAD software is for example used to model a signal through the package and over a net (i.e., a "signal net"). Substrate laminate technologies and bond interconnections may also be evaluated through the CAD software.

One exemplary prior art CAD software is Advanced Package Designer (APD) from Cadence Design Systems, Inc., of San Jose, Calif. Such CAD software is known to include verification procedures and dynamic feedback that evaluate design accuracy against a set of physical and electrical design rules, or constraints. Physical design constraints help to ensure manufacturability; electrical design constraints help to ensure electrical specifications of the design. By way of example, this CAD software generates a Design Rule Check (DRC) indicating whether the design meets the various constraints. The prior art CAD software also provides a graphical user interface to view all or part of the package design in two dimensions, for example in a flat or perspective rendition, or with levels overlaid relative to one another.

FIG. 1 illustrates one prior art system 10 for designing a package with prior art CAD software 12. CAD software 12 is stored within a computer 14, initially within a storage unit 16. A processor 18 of computer 14 operates CAD software in response to user inputs at an input interface 20 (e.g., a computer keyboard and mouse). As those skilled in the art appreciate, when initialized, CAD software 12 may also load into internal memory 22 of computer 14. A human designer at input interface 20 then controls CAD software 12, through processor 18, to create a package design 24, also stored within memory 22. The designer can command processor 18 and CAD software 12 to graphically show package design 24 at a graphical user interface 26 (e.g., a computer monitor) of system 10. Illustratively, package design 24 is graphically depicted on a display 28 of graphical user interface 26 as a five-level package model 24A shown in FIG. 2.

FIG. 2 illustrates detail of graphical model 24A. L1 of model 24A couples with a die, and L2 of model 24A couples with a PCB. Levels I(1), I(2) and (3) of model 24A represent intermediate levels of package design 24. Levels L1, I(1), I(2), I(3), L2 are shown as distinct elements and with not-to-scale orientations for ease of illustration. An illustrative signal net 30 is shown from an input connector 32 to an output connector 34 of model 24A. Signal net 30 traverses design elements in the form of traces and vias between connectors 32, 34: via 35 from connector 32 of L1 to trace 36 of I(1); trace 36 within I(1) from via 35 to via 38; via 38 from trace 36 of I(1) to trace 40 of I(2); trace 40 within I(2) from via 38 to via 42; via 42 from trace 40 of I(2) to trace 44 of I(3); trace 44 within I(3) from via 42 to via 46, which terminates at connector 34 of L2. Signal net 30 makes three signal deviations 47 from connector 32 to connector 34; each signal deviation 47 has two via-trace transition points 148 from a via to a trace (e.g., via 35 to trace 36) or from a trace to a via (e.g., trace 40 to via 42).

Another signal net 66 is shown from an input connector 68 to an output connector 70 of model 24A. Signal net 66 traverses design elements in the form of traces and vias between connectors 68, 70: via 72 from connector 68 of L1 to trace 74 of I(2); trace 74 within I(2) from via 72 to via 76, which terminates at connector 70 of L2. Via 72 extends straight through level I(1) without deviating on a trace of level I(1), and is therefore shown as via 72A (between level L1 and I(1)) and via 72B (between level I(1) and I(2)). Similarly, via 76 extends straight through level I(3) without deviating on a trace of level I(3), and is therefore shown as via 76A (between level I(2) and I(3)) and via 76B (between level I(3) and L2). Signal net 66 makes one signal deviation 77 from connector 68 to connector 70; signal deviation 77 has two via-trace transition points 178 from a via to a trace (e.g., via 72 to trace 74) or from a trace to a via (e.g., trace 74 to via 76).

With further regard to FIG. 1, CAD software 12 is also operable to generate a design database 50. In one example, design database 50 textually defines signal nets 30 and 66 of FIG. 2: signal net 30 is defined by connectors 32, 24, traces 36, 40, 44, and vias 35, 38, 42, 46; signal net 66 is defined by connectors 68, 70, trace 74, and vias 72A, 72B, 76A, 76B. Design database 50 also includes parameters (often called a "netlist") to ensure that signal nets 30 and 66 have start and end points (i.e., connectors 32, 34 for signal net 30, and connectors 68, 70 for signal net 66). A designer can manipulate design database 50 to develop the desired package design 24.

CAD software 12 utilizes design rules 52 to generate one or more DRCs 54 in the event that a design element or signal net of package design 24 exceeds a manufacturing constraint or electrical specification. By way of example, design rules 52 may specify that a trace width of trace 36 is 20 μm, to ensure manufacturability. If a designer of system 10 implements trace 36 with 10 μm, for example, then CAD software 12 generates a DRC 54A, which may be graphically displayed on model 24A, as shown in FIG. 2. The user is thus made aware that a problem may exist with trace 36.

Those skilled in the art appreciate that package design 24 often has more than the five levels illustrated in model 24A; however only five levels are shown in FIG. 2 for ease of illustration. For example, it is common that package design 24 include ground levels between each level with signal traces (I(1), I(2) and I(3); however these ground levels are not shown to simplify illustration. Those skilled in the art also appreciate that package design 24 also typically has many more signal nets and other design elements than illustrated signal nets 30 and 66. For example, package design 24 typically includes many other traces and vias (not shown) within package model 24A.

FIG. 3 illustrates package model 24A in a side view. FIG. 3 further illustrates how package design 24 connects between a die 80 and a PCB 82. Connector 32 is for example a pad that connects with a solder ball 84 of die 80; connector 34 is for example a pad that connects with signal wires of PCB 82. Similarly, connector 68 is for example a pad that connects with a solder ball 86 of die 80; connector 70 is for example a pad that connects with signal wires of PCB 82. FIG. 3 also clearly shows that signal net 30 has more signal deviations 47 than the single signal deviation 77 of signal net 66.

The increased complexity of the modem die has correspondingly increased the complexity of the package design. An example of a complex die includes a Precision Architecture—Reduced Instruction Set Computer (PA-RISC) processor produced by Hewlett Packard Corporation, which has over one billion components. The package for the PA-RISC processor must maintain high signal integrity through its signal nets; however the prior art CAD software does not simulate this signal integrity as required by the corresponding die. Accordingly, the package may be physically manufactured, at great expense, before the designer learns that the package is not suitable for operation with the die. Moreover, while the DRCs generated by the prior art CAD software may assist in manufacturability; they do not, however, warn the designer of signal net incompatibilities between the die and the package. By way of example, prior art CAD software 12 does not evaluate signal deviations 47, 77 of package model 24A. Each signal deviation 47, 77 may however cause signal distortions and delays that seriously impact signal integrity from die 80 to PCB 82. In addition, if signal nets 30, 66 operate on a common clock, the respective signals of signal nets 30, 66 from die 80 through package design 24 may be distinctly different at PCB 82, due to deviations 47, 77, thus creating undesirable non-synchronization between the signals at the PCB.

SUMMARY OF THE INVENTION

In one aspect, a method is provided for evaluating signal deviations in an electronic design, including the steps of: formulating one or more signal deviation rules; processing the electronic design to determine whether the signal deviations violate the signal deviation rules; and generating an indicator associated with the electronic design to identify violated signal deviation rules.

In another aspect, the step of processing includes the step of processing one signal net of the electronic design for violations of the signal deviation rules.

In another aspect, the electronic design is a package design, and the step of formulating includes the step of formulating one or more group signal deviation rules for a group of signal nets of the package design. In this aspect, the step of processing includes the step of processing the group of signal nets to determine whether signal deviations of the group of signal nets violate the group signal deviation rules.

In another aspect, the step of generating includes the step of generating at least one DRC for one or more violations of the group signal deviation rules.

In another aspect, the step of processing the group of signal nets includes the steps of determining a mean number of signal deviations for the signal nets within the group, and then evaluating each signal net in the group as to whether each signal net violates the group signal deviation rules. In one example, the method includes the step of determining whether each signal net has more or less than two signal deviations from the mean number. In another example, if a group of signal nets has, on average, five signal deviations per signal net, then an exemplary violation of the signal deviation rules may exist if any signal net has fewer than three, or more than seven, signal deviations.

In another aspect, the group signal deviation rules define that no signal net within the group may have more or less than X signal deviations as compared to any other signal net within the group, where X is an integer greater than or equal to one. In one example, X is two.

In still another aspect, the group signal deviation rules define that no signal net within the group may have more than Y signal deviations, where Y is an integer greater than or equal to one. In one example, Y is two. This aspect assists in designing a package with signal nets routing clock signals through the package, to maintain like-integrity in the clock signals when processed through the package.

In another aspect, the step of generating an indicator includes the step of graphically depicting a DRC on a graphical user interface illustrating the electronic design.

In yet another aspect, the step of processing includes determining a number of signal deviations within one or more signal nets of the electronic design.

In one aspect, if the electronic design is a package design, the signal deviation rules define that signal nets carrying clocking signals cannot have more than Y signal deviations; and the step of processing includes the step of determining whether any signal net carrying a clocking signal violates the Y signal deviations.

In one aspect, the step of generating an indicator includes the step of generating a report summarizing violations of the signal deviation rules.

A software product is also provided, in one aspect. The software product has instructions, stored on computer-readable media, wherein the instructions, when executed by a computer, perform steps for determining signal deviations in an electronic design, including: determining instances of signal deviations within the electronic design; comparing the instances to one or more signal deviation rules; and generating an indicator associated with the electronic design to identify violations of the signal deviation rules.

In one aspect, the software product further provides for formulating one or more of the signal deviation rules. In another aspect, the software product provides for determining whether one signal net in a group of signal nets exceeds a threshold of signal deviations. In one aspect, the software product provides for generating a report summarizing violations of the signal deviation rules. In another aspect, the software product provides for counting signal deviations within the electronic design. In one aspect, the software product provides for responding to designer inputs to scope the step of determining instances of the signal deviations.

Various ones of the methods, systems and products herein may provide certain advantages. For example, a system configured with the signal deviation software can count signal deviations in a package design, to match package performance to its corresponding die. By way of example, a die may require that a group of twenty data signals needs to maintain similar electrical properties. In order to ensure this occurs, any given signal net of a package cannot have more than approximately two signal deviations; this construct is formulated into signal deviation rules. According to certain methods herein, a designer can also use the system to determine a mean number of signal deviations in a group of signal nets, and then locate each signal net that has more or fewer signal deviations, as compared to the mean number. If for example a signal net has more than two signal deviations as compared to the mean number (or alternatively two signal deviations fewer than the mean number), then such a signal net may violate the signal deviation rules that help ensure proper clocking through the package. In another example, all clock signals within a package must meet very high standards set by its corresponding die. The signal deviation rules may thus specify that each signal net cannot have more than, for example, two signal deviations—to ensure high integrity signal transition from the die to the PCB.

BRIEF DESCRIPTION OF THE DRAWINGS

FIG. 8A and FIG. 8B show a flowchart illustrating one method for processing a package design to evaluate signal deviations.

DETAILED DESCRIPTION OF THE DRAWINGS

Figure 1:
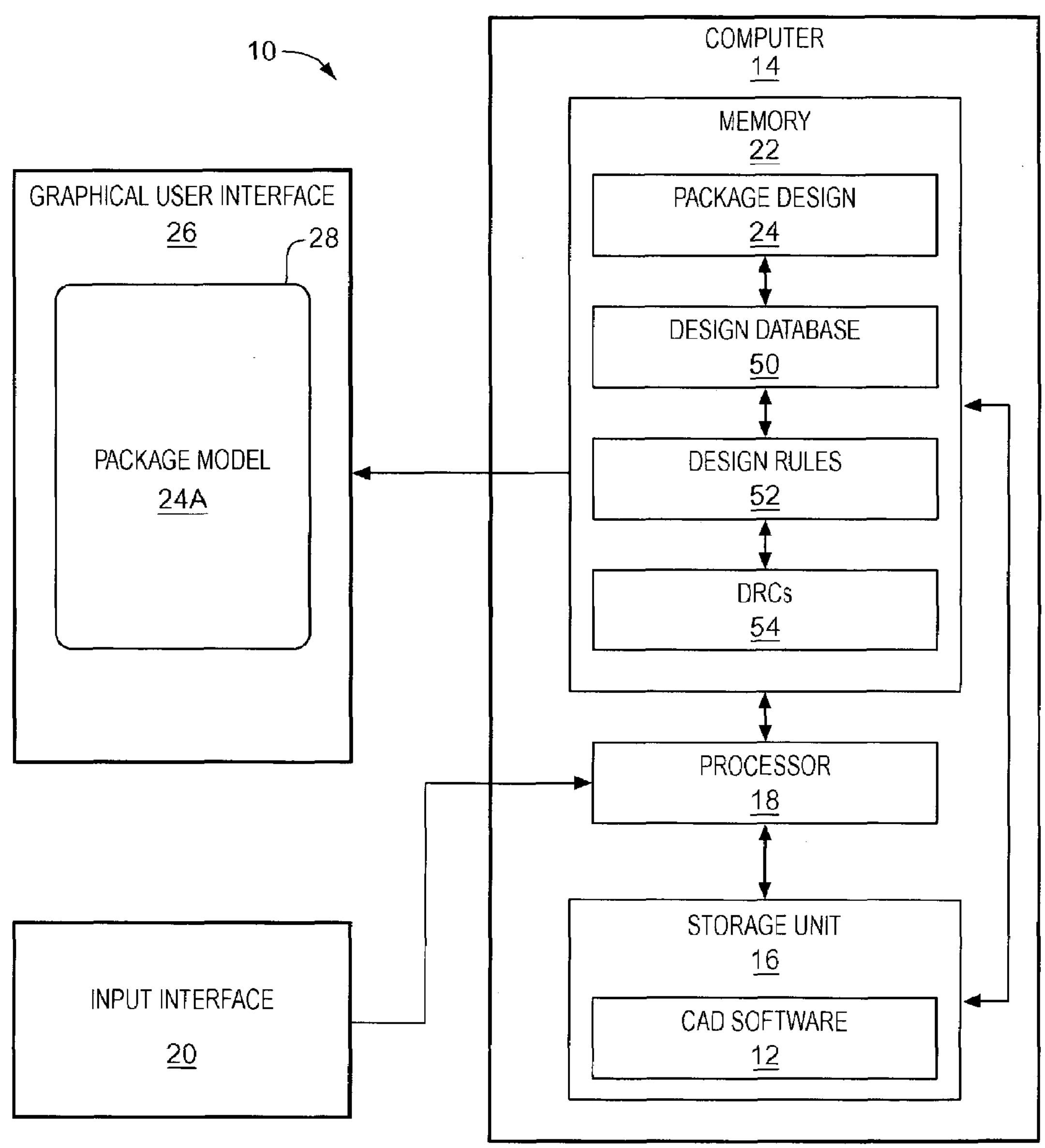
FIG. 1 shows a prior art system and CAD software for designing a package.
Figure 2:
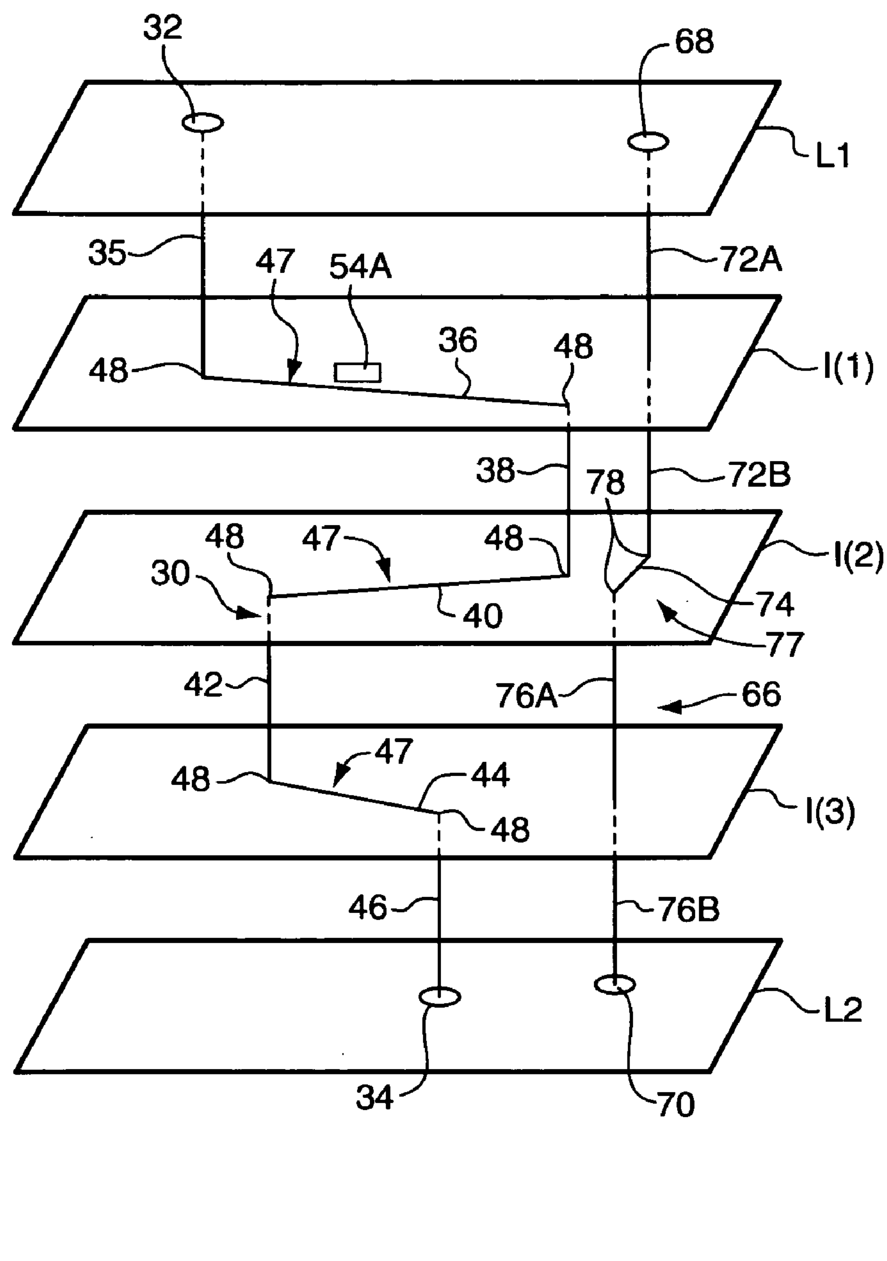
FIG. 2 shows, in a perspective 3D view, one illustrative graphical model of the package design of FIG. 1.
Figure 3:
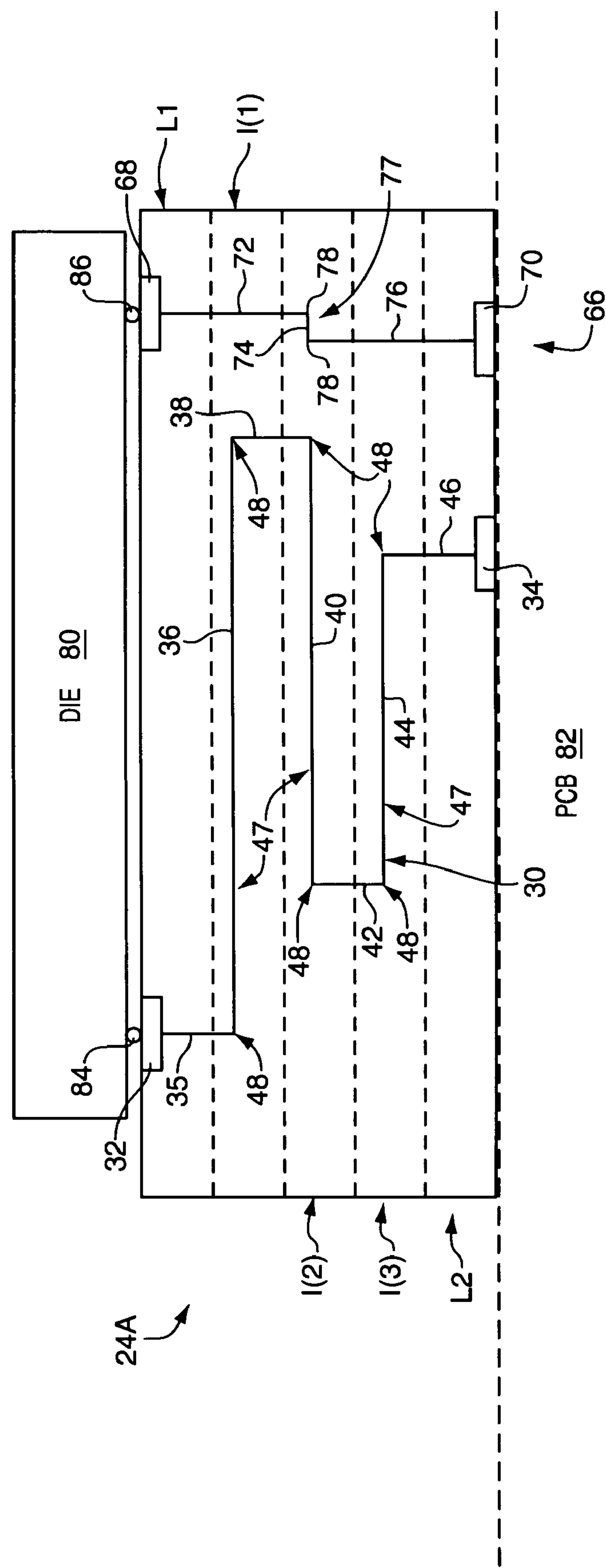
FIG. 3 illustrates the package design of FIG. 1 in a side view.
Figure 4:
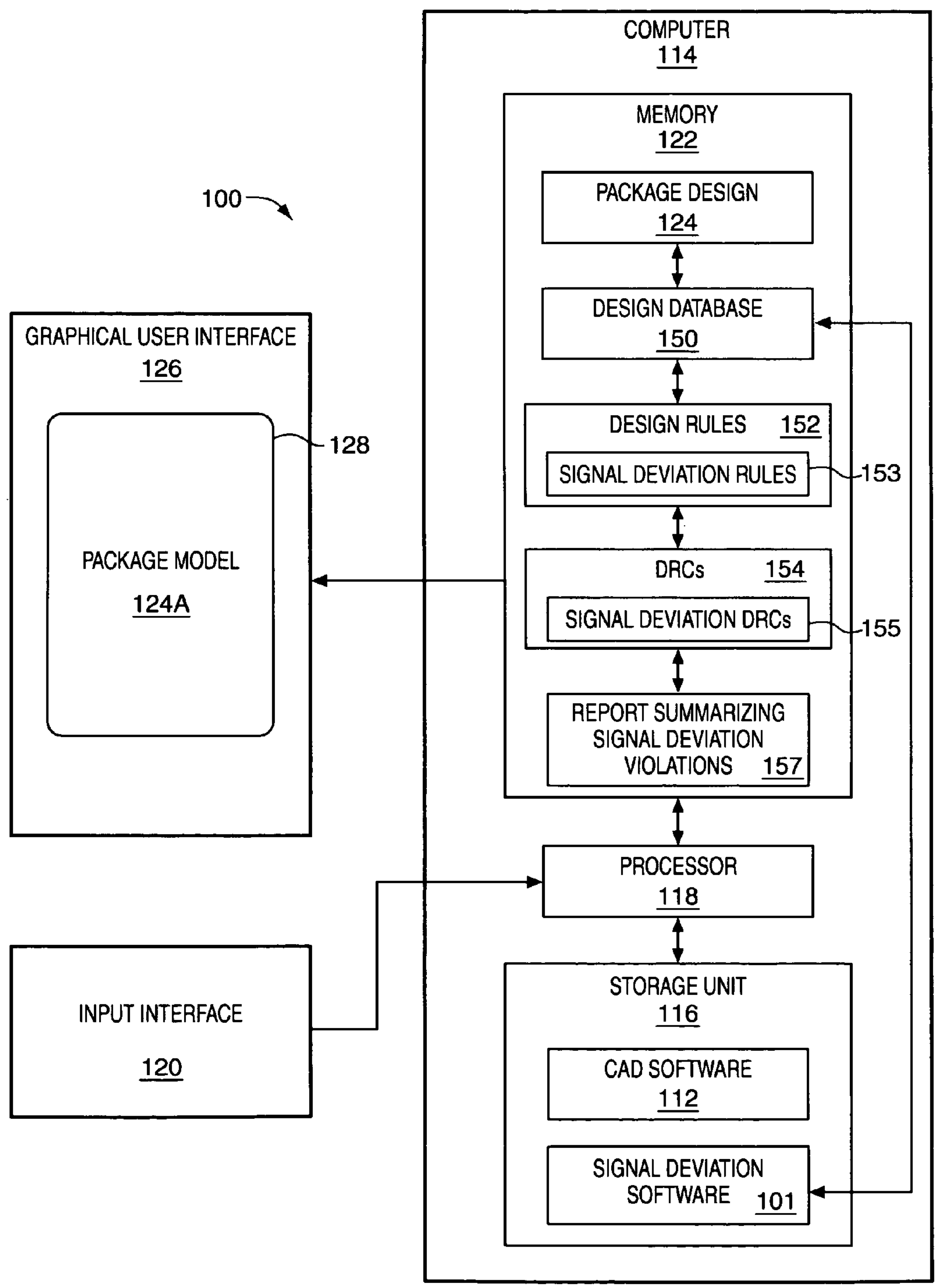
FIG. 4 shows one system for evaluating signal deviations in a package design.
Figure 5:
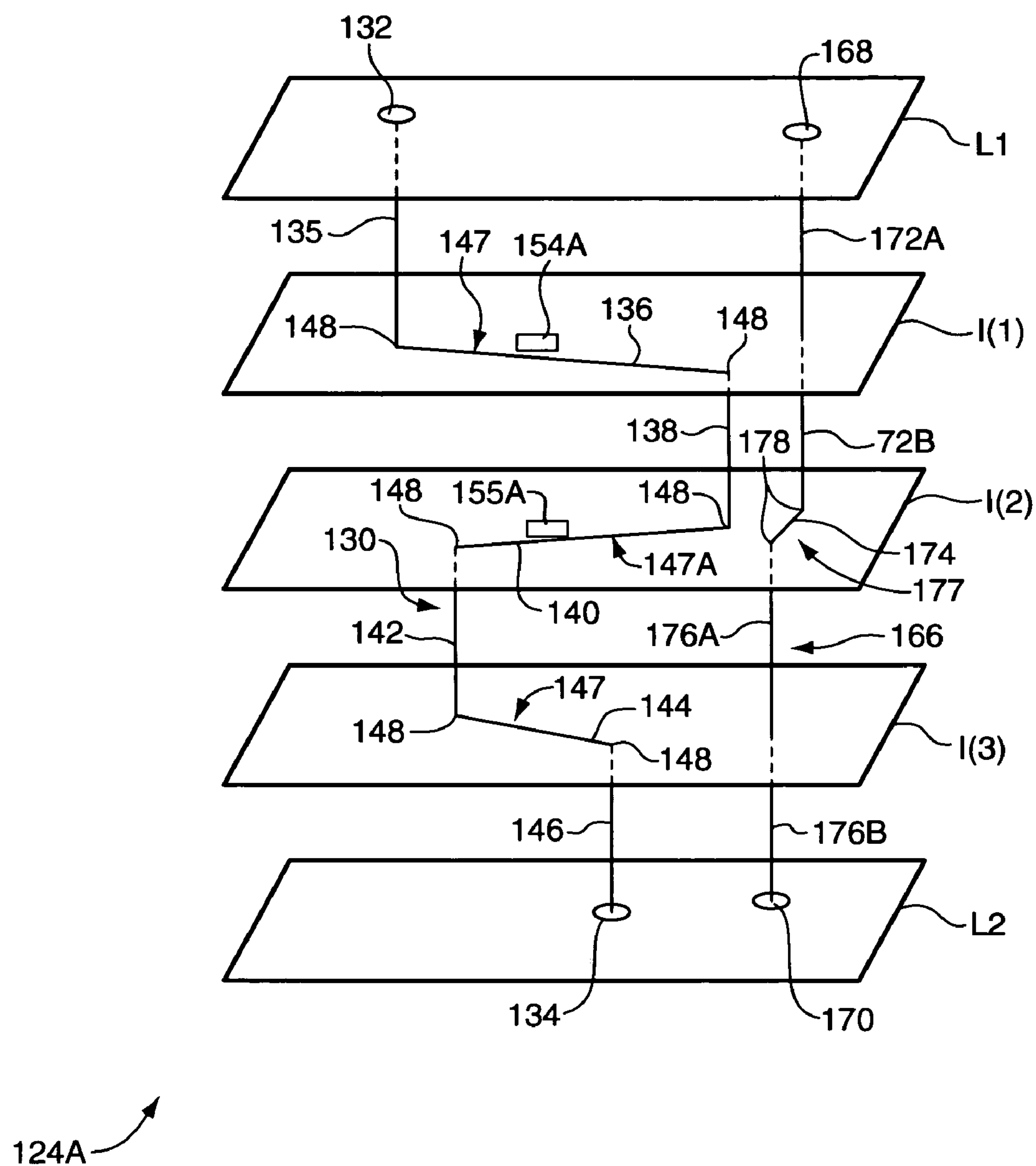
FIG. 5 illustrates one package design processed by the system of FIG. 4.

FIG. 4 shows one system 100 for designing and evaluating a package design utilizing CAD software 112 and signal deviation software 101. CAD software 112 and signal deviation software 101 are stored within a computer 114, initially within a storage unit 116. A processor 118 of computer 114 operates CAD software 112 and signal deviation software 101 in response to user inputs at an input interface 120 (e.g., a computer keyboard and mouse). When initialized, CAD software 112 and signal deviation software 101 may load into internal memory 122 of computer 114 as sets of instructions. A human designer at input interface 120 may then control CAD software 112 and signal deviation software 101, through processor 118, to create a package design 124, also stored within memory 122. The designer can command processor 118 and CAD software 112 to graphically show package design 124 in one or more dimensions at a graphical user interface 126 (e.g., a computer monitor) of system 100. Illustratively, package design 124 is graphically depicted on a display 128 of graphical user interface 126 as a five-level package model 124A, shown and described in connection with FIG. 5. In FIG. 5, L1 of model 124A couples with a die, and L2 of model 124A couples with a PCB. Levels I(1), I(2) and (3) of model 124A represent intermediate levels of package design 124. Levels L1, I(1), I(2), I(3), L2 are shown as distinct elements and with not-to-scale orientations for ease of illustration.

An illustrative signal net 130 is shown in FIG. 5 from an input connector 132 to an output connector 134 of model 124A. Signal net 130 traverses design elements in the form of traces and vias between connectors 132, 134: via 135 from connector 132 of L1 to trace 136 of I(1); trace 136 within I(1) from via 135 to via 138; via 138 from trace 136 of I(1) to trace 140 of I(2); trace 140 within I(2) from via 138 to via 142; via 142 from trace 140 of I(2) to trace 144 of I(3); trace 144 within I(3) from via 142 to via 146, which terminates at connector 134 of L2. Signal net 130 makes three signal deviations 147 from connector 132 to connector 134; each signal deviation 147 has two via-trace transition points 148 from a via to a trace (e.g., via 135 to trace 136) or from a trace to a via (e.g., trace 140 to via 142).

Another illustrative signal net 166 is shown from an input connector 168 to an output connector 170 of model 124A. Signal net 166 traverses design elements in the form of traces and vias between connectors 168, 170: via 172 from connector 168 of L1 to trace 174 of I(2); trace 714 within I(2) from via 172 to via 176, which terminates at connector 170 of L2. Via 172 extends straight through level I(1) without deviating on a trace of level I(1), and is therefore shown as via 172A (between level L1 and level I(1)) and via 172B (between level I(1) and level I(2)). Similarly, via 176 extends straight through level I(3) without deviating on a trace of level I(3), and is therefore shown as via 176A (between level I(2) and level I(3)) and via 176B (between level I(3) and level L2). Signal net 166 has one signal deviation 177 from connector 168 to connector 170; signal deviation 177 has a pair of via-trace transition points 178 from a via to a trace (e.g., via 172 to trace 174) or from a trace to a via (e.g., trace 174 to via 176).

CAD software 112 is operable to generate a design database 150. In one example, design database 150 textually defines signal net 130, including connectors 132, 134, traces 136, 140, 144, and vias 135, 138, 142, 146. Design database also textually defines signal net 166, including connectors 168, 170, trace 174, and vias 172A, 172B, 176A, 176B.

Signal deviation software 101 is operable to process design database 150 to determine and evaluate signal deviations within package design 124. Design database 150 includes parameters (e.g., a netlist) to ensure that signal nets 130, 166 have appropriate start and end points (i.e., that signal net 130 has start and end points 132, 134, respectively, and that signal net 166 has start and end points 168, 170, respectively). A designer can manipulate design database 150 to develop the desired package design 124. As a matter of design choice, signal deviation software 101 may be combined with CAD software 112.

CAD software 112 processes design database 150 and utilizes design rules 152 to generate one or more Design Rule Checks (DRCs) 154 in the event that a design element or signal net of package design 124 exceeds a manufacturing constraint or electrical specification. One DRC 154A is illustratively shown in model 124A, for example illustrating non-manufacturability of trace 136. A DRC 154 may also be a textual indicator, for example a statement written to a report 157, described below. Illustratively, such a textual DRC 154 may for example state: DRC 154A=trace 136 violates physical constraint of 20 μm.

Figure 8B:
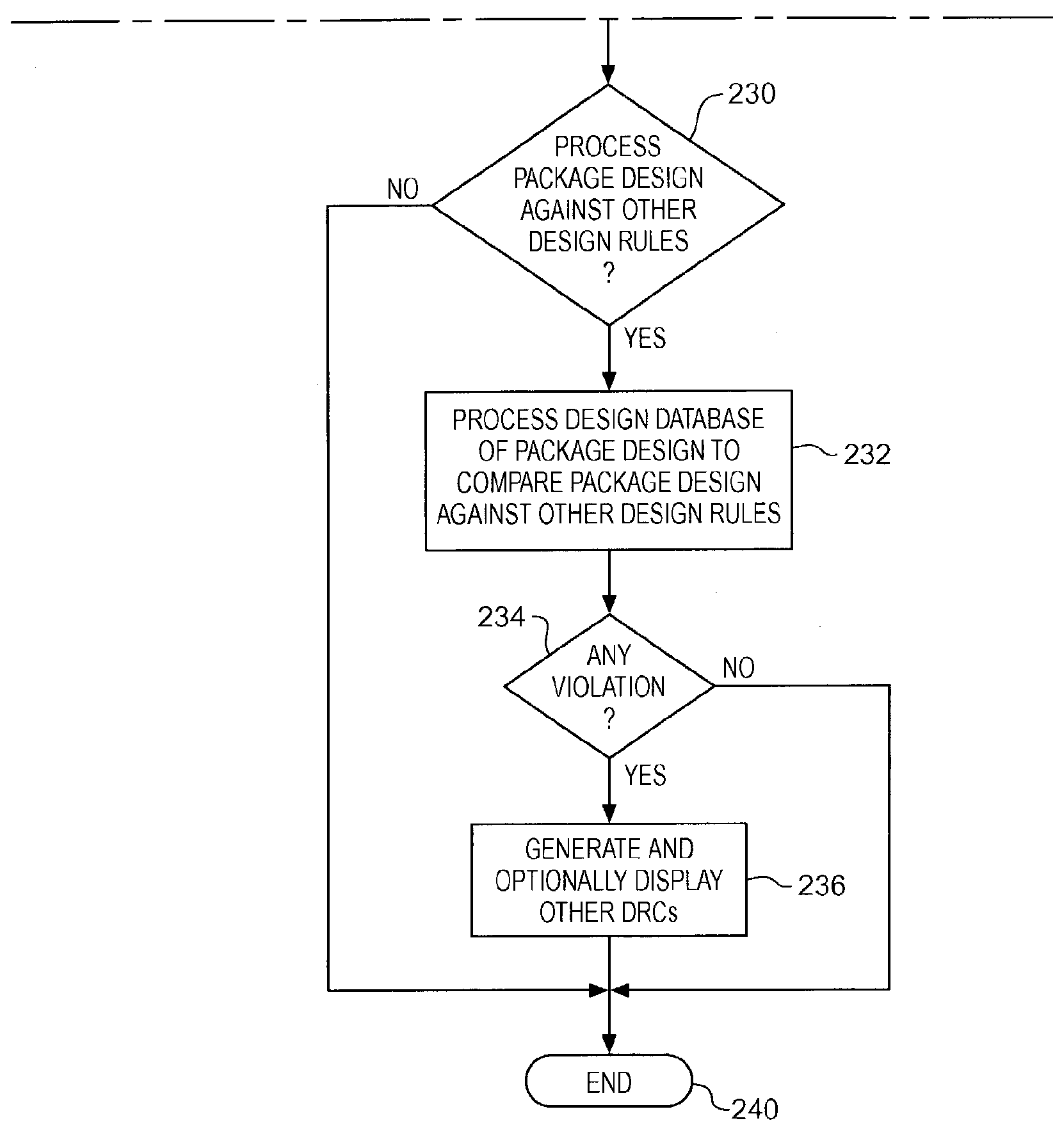

Signal deviation software 101 processes design database 150 and utilizes signal deviation rules 153 to generate one or more signal deviation Design Rule Checks (DRCs) 155. One DRC 155A is illustratively shown in FIG. 5, indicating a violation of signal deviation rules 153. DRC 155A for example illustrates that one signal deviation 147A is not allowed by signal deviation rules 153. All violations of signal deviation rules 153 may be summarized in a report 157 managed by signal deviation software 101, as shown. FIG. 8A and FIG. 8B describe the operation of system 100 in its generation and utilization of signal deviation rules 153 and DRCs 155. Illustratively, a representative signal deviation rule may be stated textually as follows: each signal net in a group of signal nets cannot have more or fewer signal deviations than any other signal net in the group. This illustrative rule ensures that each signal net has an identical number of signal deviations. A DRC 155 may also be a textual indicator, for example a statement written to report 157. Illustratively, such a textual DRC 155 may for example state: DRC 155A=trace 140 of signal net 130 exceeds allowable signal deviations.

Figure 6:
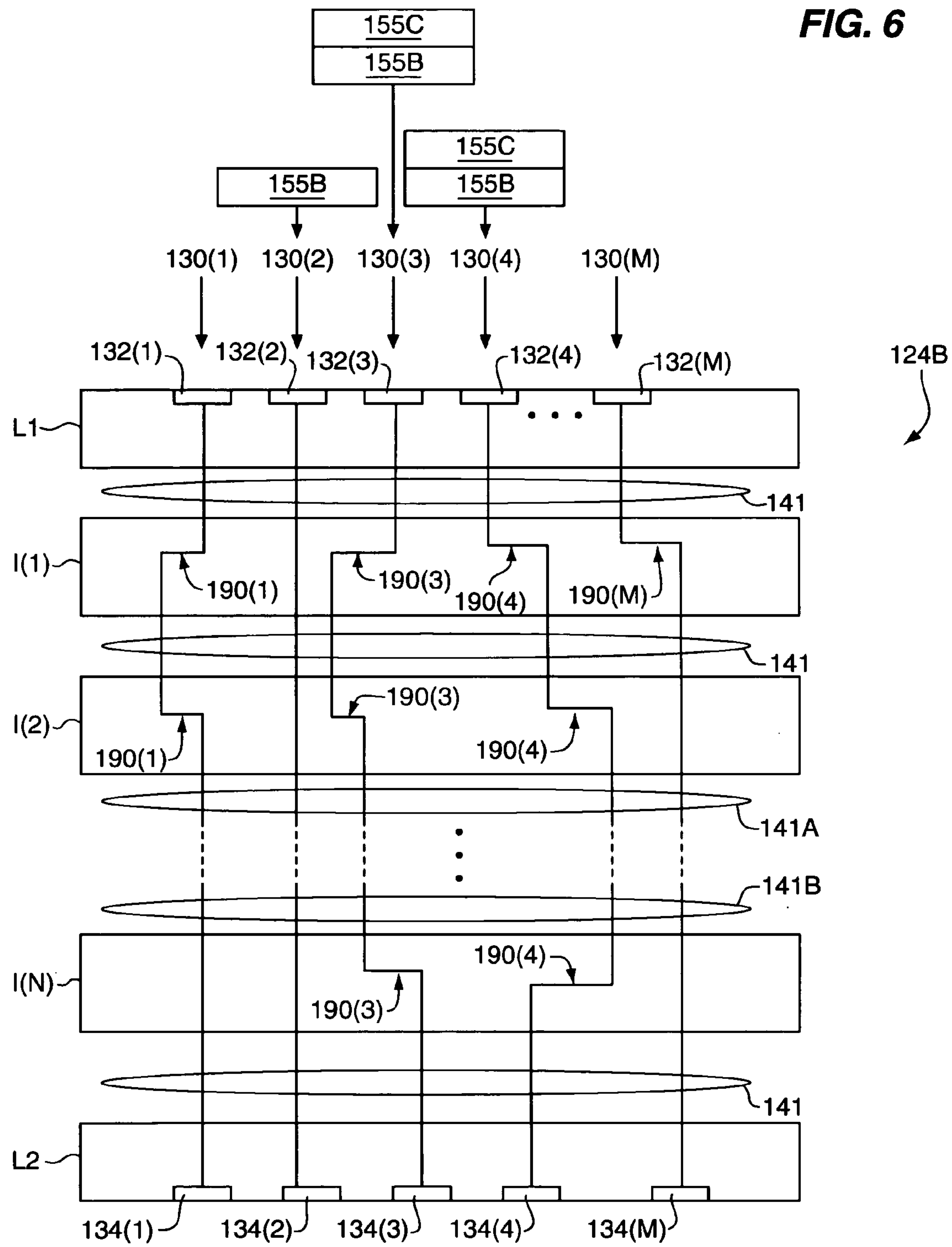
FIG. 6 illustrates one other package design processed by the system of FIG. 4.

FIG. 6 illustrates an (N+2)-level package model 124B; L1 and L2 represent the top and bottom levels, respectively, with N intermediate levels I(1), I(2) . . . I(N), where N is an integer value greater than or equal to one. Each level of package model 124B is shown in a side view, for purposes of illustration, even though it should be clear to those skilled in the art that levels L1, I(1)–I(N), L2 combine to form a modular package design. Package model 124B also has a plurality of signal nets 130(1), 130(2), 130(3), 130(4) . . . 130(M) formed between respective input and output connectors 132, 134, as shown, where M is an integer representing a number of signal nets 130 of model 124B. A plurality of vias 141 connect signal nets 130 between levels of model 124B, as illustrated. Vias 141A and 141B illustrate connectivity between level I(2) and I(N), as a multitude of levels may exist therebetween. Certain signal nets 130 have one or more signal deviations 190, as shown: signal net 130(1) has two signal deviations 190(1); signal net 130(2) has no signal deviations; signal nets 130(3), 130(4) each have three signal deviations 190(3), 190(4), respectively; and signal net 130(M) has one signal deviation 190(M).

As described in FIG. 8A and FIG. 8B, system 100 of FIG. 4 may for example generate one or more DRCs 155 when any signal net 130 has signal deviations that exceed a maximum number set forth in signal deviation rules 153. Signal deviation rules 153 may operate on one or a plurality of relationships between multiple signal nets 130, as described in FIG. 8A and FIG. 8B.

Figure 7:
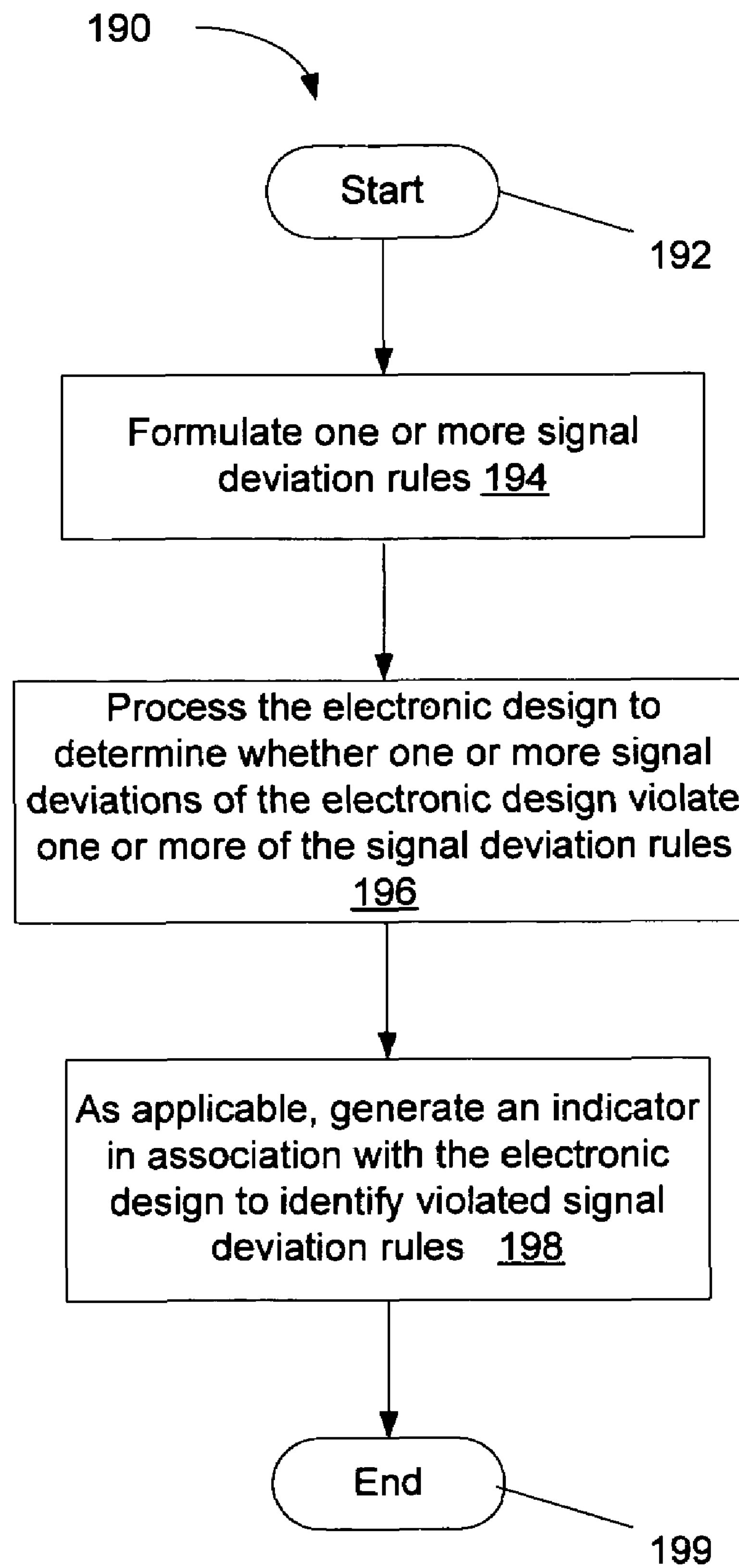
FIG. 7 is a flowchart illustrating one process for evaluating signal deviations in an electronic design.

FIG. 7 is a flowchart illustrating one process 190 for evaluating signal deviations in an electronic design. After start 192, one or more signal deviation rules are formulated, in step 194. In step 196, the electronic design is processed to determine whether one or more signal deviations of the electronic design violate one or more of the signal deviation rules. In step 198, an indicator (e.g., a signal deviation DRC) is generated in association with the electronic design to identify violated signal deviation rules, if any. Process 190 terminates at 199.

FIG. 8A and FIG. 8B show a flowchart illustrating one process 200 for generating and utilizing signal deviation rules (e.g., rules 153) and signal deviation DRCs (e.g., DRCs 155) with respect to a package design (e.g., design 124). System 100 of FIG. 4 for example utilizes process 200 to generate DRC 154A and DRC 155A in FIG. 5.

After start 202, a package design is selected in step 204; by way of example, step 204 may automatically select a current package design 124 being created by CAD software 112.

At step 206, signal deviation rules are created. Process 200 shows two exemplary techniques for creating signal deviation rules. In one example, signal deviation rules are formulated 206 by processing input specifications of the die which couples with the package design, as indicated by direct data input 208. In another example, a designer manually formulates 206 signal deviation rules, as indicated by designer input 210. The formulated signal deviation rules are loaded to computer memory (e.g., memory 122, FIG. 4) in step 212, so that the signal deviation rules may operate with the package design selected in step 204. Signal deviation software 101, FIG. 4, may perform or facilitate some or all of steps 206–212.

Step 214 determines the scope of subsequent signal deviation evaluations. Illustratively, this determination 214 may derive from direct data input 208 associated with die specifications, or from designer inputs 210. The outputs of step 214 associate with the scope determined in step 214.

In one example, a designer selects a “single signal net” of the package design to be processed for validation against the signal deviation rules. Computer 114 of system 100 responds to the request to evaluate the signal net and processes design database 150 to locate signal deviations, as indicated by step 216. For example, if signal net 130 of model 124A, FIG. 5, were selected, then all signal deviations 147 are detected and compared against signal deviation rules 153.

Step 218 is a decision. If a trace violates one or more of the signal deviation rules, one or more signal deviation DRCs 155 are generated (and optionally displayed with model 124A, for example, as DRC 155A), as indicated by step 220. Optionally, a designer may also publish a report summarizing violations of the signal deviation rules, as in step 221. If no violation occurs, processing continues with step 222.

In another option, from step 214, a “signal net group” of a package design are to be processed for validation against the signal deviation rules. Computer 114 of system 100 responds to the request to evaluate all signal nets in the group and processes design database 150 to evaluate signal deviations within the grouped signal nets, as indicated by step 224. For example, if signal nets 130(1), 130(2), 130(3), 130(4) . . . 130(M) of model 124B, FIG. 6, are selected for the scope of the evaluation, then, in step 224, each of signal nets 130(1), 130(2), 130(3), 130(4) . . . , 130(M) are evaluated for signal deviations; these signal deviations are then compared against signal deviation rules 153. Step 226 is a decision. If one or more signal nets of the group violate one or more of the signal deviation rules, one or more signal net DRCs 155 are generated (and optionally displayed with model 124A, for example, as DRC 155A), as indicated by step 220. If no violation occurs, processing continues with step 222.

In one example, such a group of signal nets are evaluated to ensure that a group of electrical signals processed through the grouped signal nets maintains similar electrical properties. Signal properties change depending upon the number of signal deviations experienced through a signal net. Therefore, signal deviation rules 153 may specify, for example, that any signal net in a group cannot have more than, or less than, two signal deviations as compared to any other signal net of the group. For example, in FIG. 6, signal net 130(2) of the group of signal nets 130(1)–130(M) has no signal deviations, and yet signal nets 130(3), 130(4), on the other hand, each have three signal deviations 190(3), 190(4), respectively. Signal net 130(1) has two signal deviations 190(1), and signal net 130(M) has one signal deviation 190(M). Accordingly, step 226 in this example determines that a violation exists and step 220 generates one or more signal deviation DRCs 155, as indicated as signal deviation DRCs 155B in FIG. 6, adjacent each of the offending signal nets 130(2), 130(3), 130(4) in the group of signal nets.

In another example, the group of signal nets may be selected and compared to signal deviation rules 153 which state that no signal net carrying a clock signal may have more than two signal deviations. If for example signal nets 130(2), 130(3), 130(4) each carried such a clock signal, then DRCs 155C are generated 220, in this example, for each signal net 130(3), 130(4) since each violated the signal deviation rules.

Step 222 is a decision. If additional signal deviation evaluations (with differing scope) are designated, step 214 repeats; otherwise, process 200 continues with step 230. Step 230 is a decision. If the package design is to be evaluated against other design rules (e.g., rules 154, FIG. 4), step 232 processes the design database relative to the other design rules. Step 234 is a decision. If other DRCs 154 exist due to violation of the other design rules, process 200 continues with step 236; otherwise process 200 ends at step 240. In step 236, one or more other DRCs (e.g., DRC 154A, FIG. 4) may be generated and optionally displayed.

The following "pseudo" code illustrates one example for evaluating signal deviations for a single designer-selected signal net in a package design.

```
****Pseudo Code****
VARIABLES:
Die_Specification :          (Structure to contain specifics for die selected)
Die_Specification_File :     (Name of file containing die specifications)
Package_Design_List :        (Structure to contain a list of all design elements in the design
                              database)
Design_Element_List :        (Structure to contain a list of design elements selected from the
                              Package_Design_List)
Design_Name :                (Variable identifying the specific design to be validated)
Designer_Signal_Net :        (Variable to store the identifier for the signal net selected by the
                             designer)
Design_Rule_List :           (Structure to contain a list of design rules)
Design_Rule_Checks_List:     (Structure to contain a list of design rule violations)
{Load Specification for the die used by the package into a list variable.}
Die_Specification := LoadDieSpecificationFromFile(Die_Specification_File);
{Load the package design from the design database}
Package_Design_List := LoadPackageDesign(Design_Name);
{Generate die specific design rules from the die specification}
Design_Rule_List := GenerateDesignRules(Die_Specification);
{Add any design rules input by the designer}
Design_Rule_List := Design_Rule_List + Input_Designer_Rules( );
{Input the signal net identification as selected by the designer for this check}
Designer_Signal_Net := Input_Designer_Signal_Net_Choice( );
{Select a single signal net from the package design, as specified by the designer}
Design_Element_List := SelectDesignElementsForChecking(Package_Design_List,
                                                  Single_Signal_Net,
                                                  Designer_Selected_Net);
{Empty the list for storing the DRCs detected}
Design_Rule_Check_List := EMPTY;
{The Design_Rule_Check function tests each design element against all rules in the
Design_Rule_List, returning a DCR if the check fails. The DRC is added to the
Design_Rule_Checks_List for later processing.}
Design_Rule_Checks_List := Design_Rule_Check(Design_Element_List, Design_Rule_List);
IF COUNT_ITEMS_IN_LIST(Design_Rule_Checks_List) > 0 THEN
BEGIN
    {Generate a DRC report for all detected DCRs}
    Generate_Design_Rule_Check_Report(Design_Rule_Checks_List);
    IF Design_Rule_Check_Display_Selected THEN
    BEGIN
        {If the DRCs are to be displayed on screen, the
        Generate_Design_Rule_Check_Display function sends the detected DCRs for
        output on the display}
        Generate_Design_Rule_Check_Display(Design_Rule_Checks_List);
    END IF;
END IF;
```

In this example, the Design_Element_List contains a list of all design elements in a single signal net. The Design_Rule_Check function steps through all design rules in the Design_Rule_List, and tests each design element in the Design Element List for signal deviations. Only pseudo code for one Signal_Deviation_Rule is shown in the case statement for clarity. The pseudo code for the Signal_Deviation_Rule calculates the number of signal deviations in the single signal net stored in the Design Element List, and compares the signal deviation number with the maximum permissible signal deviation defined in the Signal_Deviation_Rule.

```
FUNCTION Design_Rule_Check(Design_Element_List, Design_Rule_List) : DRC_List;
VARIABLES
Design_Rule_Index :       (Index variable used to step through Design_Rule_List)
Design_Element_Index :    (Index variable used to step through Design Element List)
DRC_List :                (List to build the Returned DRCs)
Deviation_Count :         (Variable for counting the number of signal deviations)
BEGIN
    DRC_List := EMPTY;      {Clear the return DCR list}
    {Step through the design rules in the Design Rule List and check each design
     element in the Design Element List to which the rule applies. Accumulate DRCs
     in the DRC_List to be returned at the end of the function.}
    FOR Design_Rule_Index := 1 to COUNT_ITEMS_IN_LIST(Design_Rule_List) DO
    BEGIN
        CASE Design_Rule_List[Design_Rule_Index].Type OF
        ...
        Signal_Deviation_Rule:
        BEGIN
            Deviation_Count := 0;
            {Step through the single net list and compute the signal deviation}
            FOR Design_Element_Index:= 1 to
                COUNT_ITEMS_IN_LIST(Design_Element_List) - 1 DO
            BEGIN
                {Count the number of deviations in the trace}
                IF ComputeAngle(Design_Element_List[Design_Element_Index],
                            Design_Element_List[Design_Element_Index+1]) > 0 THEN
                BEGIN
                    Deviation_Count := Deviation_Count + 1;
                END IF;
                IF Deviation_Count > Design_Rule_List[Design_Rule_Index].Maximum THEN
                BEGIN
                    {The Rule failed, so add the DCR to the DCR list to be returned on
                    completion of the function}
                   DRC_List := DRC_List + DRC(Design_Rule_List[Design_Rule_Index].Type);
                END IF;
            END FOR;
        END Signal_Deviation_Rule;
        ...
      END CASE;
    END FOR;
    RETURN DRC_List; {Return the results for the Design Rule Check function}
END FUNCTION;
*****End Pseudo Code****
```

Changes may be made in the above methods and systems without departing from the scope hereof. It should thus be noted that that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for evaluating signal deviations in an electronic design, comprising the steps of:

formulating one or more signal deviation rules;

processing the electronic design to determine whether the signal deviations of the electronic design violate the signal deviation rules; and generating an indicator associated with the electronic design to identify violated signal deviation rules.

2. A method of claim 1, the step of processing comprising the step of processing one signal net of the electronic design for violation of the signal deviation rules.

3. A method of claim 1, the electronic design comprising a package design, the step of formulating comprising the step of formulating one or more group signal deviation rules for a group of signal nets of the package design, wherein the step of processing comprises the step of processing the group of signal nets to determine whether signal deviations of the group of signal nets violate the group signal deviation rules.

4. A method of claim 3, the step of generating comprising the step of generating at least one DRC for one or more violations of the group signal deviation rules.

5. A method of claim 3, wherein the step of processing the group of signal nets comprises the steps of determining a mean number of signal deviations for the signal nets within the group, and then evaluating each signal net in the group as to whether each signal net violates the group signal deviation rules.

6. A method of claim 5, further comprising the step of determining whether each other signal net has more or less than two signal deviations from the mean number.

7. A method of claim 3, the group signal deviation rules defining that no signal net within the group may have more or less than X signal deviations as compared to any other signal net within the group, X being an integer greater than or equal to one.

8. A method of claim 3, the group signal deviation rules defining that no signal net within the group may have more than Y signal deviations, Y being an integer greater than or equal to 1.

9. A method of claim 1, the step of generating an indicator comprising the step of graphically depicting a DRC on a graphical user interface illustrating the electronic design.

10. A method of claim 1, the step of processing comprising determining a number of signal deviations within one or more signal nets of the electronic design.

11. A method of claim 1, the electronic design comprising a package design, the signal deviation rules defining that signal nets carrying clocking signals cannot have more than Y signal deviations, the step of processing comprising the step of determining whether any signal net carrying a clocking signal violates Y signal deviations.

12. A method of claim 11, Y is two.

13. A method of claim 1, the step of generating an indicator comprising generating a report summarizing violations of the signal deviation rules.

14. A software product comprising instructions, stored on computer-readable media, wherein the instructions, when executed by a computer, perform steps for determining signal deviations in an electronic design, comprising:

instructions for determining instances of signal deviations within the electronic design;

instructions for comparing the instances to one or more signal deviation rules; and instructions for generating an indicator associated with the electronic design to identify violations of the signal deviation rules.

15. The software product of claim 14, further comprising instructions for formulating one or more of the signal deviation rules.

16. The software product of claim 14, further comprising instructions for determining whether one signal net in a group of signal nets exceeds a threshold of signal deviations.

17. The software product of claim 14, further comprising instructions for generating a report summarizing violations of the signal deviation rules.

18. The software product of claim 14, further comprising instructions for counting signal deviations within the electronic design.

19. The software product of claim 14, further comprising instructions for responding to designer inputs to scope the step of determining instances of signal deviations.

20. A system for evaluating signal deviations in an electronic design, comprising:

means for formulating one or more signal deviation rules;

means for processing the electronic design to determine whether the signal deviations of the electronic design violate the signal deviation rules; and means for generating an indicator associated with the electronic design to identify violated signal deviation rules.

* * * * *

UNITED STATES PATENT AND TRADEMARK OFFICE

CERTIFICATE OF CORRECTION

PATENT NO. : 7,055,124 B2
APPLICATION NO. : 10/368758
DATED : May 30, 2006
INVENTOR(S) : Mark D. Frank et al.

It is certified that error appears in the above-identified patent and that said Letters Patent is hereby corrected as shown below:

In column 3, line 43, delete “modem” and insert -- modern --, therefor.

Signed and Sealed this

Seventeenth Day of March, 2009

JOHN DOLL
*Acting Director of the United States Patent and Trademark Office*